(12) United States Patent
Kenichi (10) Patent No.: US 10,935,599 B2
(45) Date of Patent: Mar. 2, 2021

(54) TEST APPARATUS AND TEST METHOD

(71) Applicant: Advantest Corporation, Tokyo (JP)

(72) Inventor: Nagatani Kenichi, Tokyo (JP)

(73) Assignee: ADVANTEST CORPORATION, Tokyo (JP)

( * ) Notice: Subject to any disclaimer, the term of this patent is extended or adjusted under 35 U.S.C. 154(b) by 164 days.

(21) Appl. No.: 16/146,701

(22) Filed: Sep. 28, 2018

(65) Prior Publication Data

US 2019/0170823 A1 Jun. 6, 2019

(30) Foreign Application Priority Data

Dec. 6, 2017 (CN) .......................... 201711276164.7

(51) Int. Cl.
*G01R 31/28* (2006.01)
*G01R 31/317* (2006.01)
*G01R 31/3177* (2006.01)

(52) U.S. Cl.
CPC ... *G01R 31/31725* (2013.01); *G01R 31/3177* (2013.01); *G01R 31/31703* (2013.01); *G01R 31/31709* (2013.01)

(58) Field of Classification Search
CPC ........ G01R 31/31725; G01R 31/31703; G01R 31/31709; G01R 31/3177
USPC .......................... 714/731, 733, 734, 736, 744
See application file for complete search history.

(56) References Cited

U.S. PATENT DOCUMENTS

| 5,919,270 A | * | 7/1999 | Arkin | ............... | G01R 31/31919 |
| | | | | | 714/736 |
| 2002/0188888 A1 | | 12/2002 | Rivoir | | |
| 2005/0222789 A1 | | 10/2005 | West | | |
| 2007/0247181 A1 | * | 10/2007 | Ishida | .............. | G01R 31/31908 |
| | | | | | 324/762.01 |
| 2008/0040060 A1 | * | 2/2008 | Hou | ................. | G01R 31/31937 |
| | | | | | 702/82 |

* cited by examiner

*Primary Examiner* — Christine T. Tu (57) ABSTRACT

A time measurement unit measures the time interval between edges to be monitored in a signal under test DUT_Output including serial data output from a device under test (DUT) 400. A comparison judgment unit calculates the number of bits of the serial data included between the edges to be monitored, based on the time interval thus measured. Furthermore, the comparison judgment unit compares the number of bits thus calculated with an expected value thereof.

20 Claims, 9 Drawing Sheets

TEST APPARATUS AND TEST METHOD

CROSS-REFERENCE TO RELATED APPLICATIONS

This Application claims the benefit of and priority to Chinese Application No. 201711276164.7, filed on Dec. 6, 2017, which is hereby incorporated by reference in its entirety.

FIELD OF THE INVENTION

The present invention relates to a test apparatus.

DESCRIPTION OF THE RELATED ART

As a high-speed data transmission method for data transmission between semiconductor devices, a source synchronous method is known. With this method, in addition to a data signal, a clock signal is transmitted via a pair of transmission lines in synchronization with the data signal. For example, the HDMI (trademark) (High-Definition Multimedia Interface) employs the source synchronous method.

Figure 1:
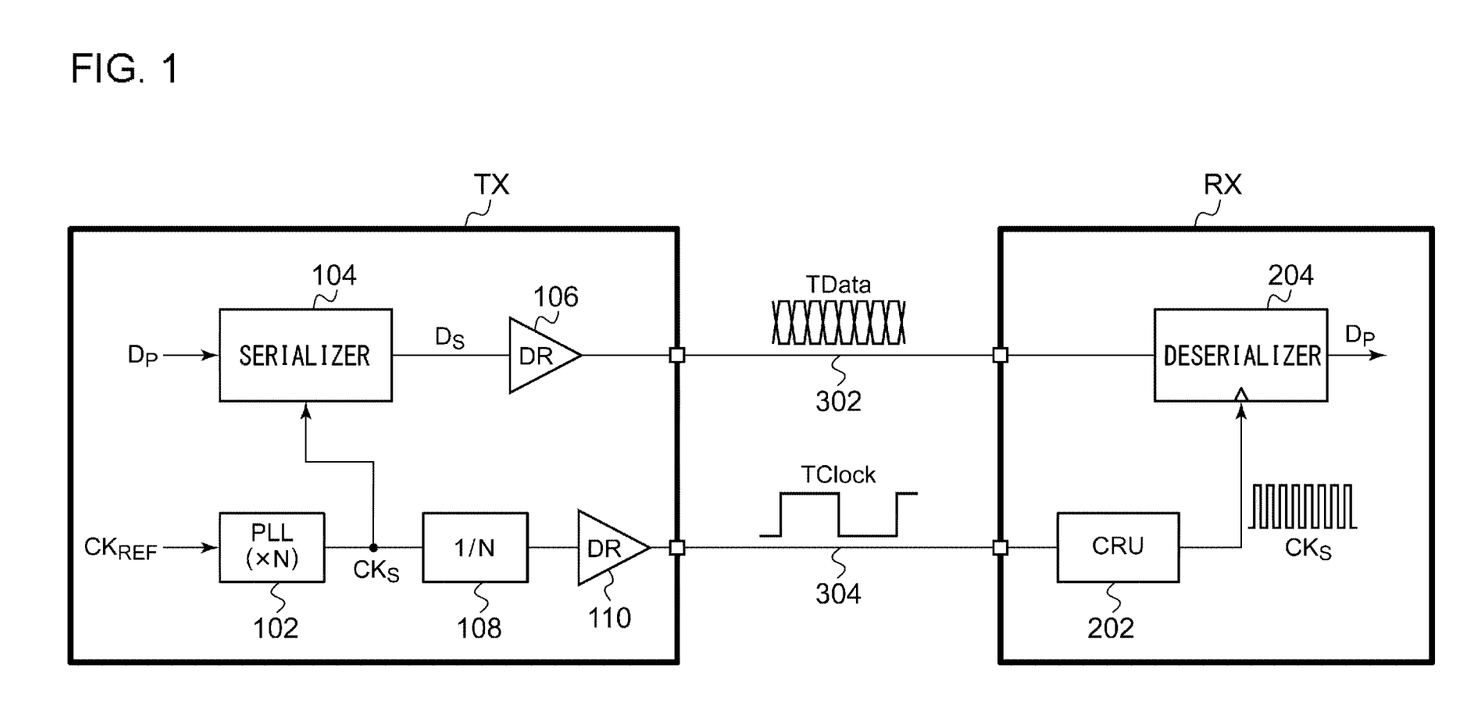
FIG. 1 is a block diagram showing a transmitter TX and a receiver RX employing a source synchronous method.

FIG. 1 is a block diagram showing a transmitter TX and a receiver RX employing the source synchronous method. The transmitter TX includes a PLL circuit 102, a serializer 104, a driver 106, a frequency divider 108, and a driver 110.

The PLL circuit 102 generates a serial clock $CK_S$ by frequency multiplying the reference clock $CK_{REF}$ by N. With the TMDS (Transition Minimized Differential Signaling) employed in HDMI, N is set to 10. The serializer 104 performs parallel/serial conversion of parallel data $D_P$ to be transmitted into serial data $D_S$ using the serial clock $CK_S$. The driver 106 drives a data line 302 according to the serial data $D_S$. In this drawing, a single data line 302 is shown. In a case of employing a differential operation, a pair of data lines 302 are employed.

The TMDS employs a clock forward method. In this method, a serial signal is transmitted with a frequency that is an integer multiple of the clock signal. The frequency divider 108 frequency divides the serial clock $CK_S$ by N. The driver 110 drives a clock line 304 according to a base clock after the frequency division. With this arrangement, a data signal TData and a clock signal TClock are transmitted to the receiver RX.

The receiver RX includes a CRU (Clock Recovery Unit) 202 and a deserializer 204. The CRU 202 frequency multiplies the clock signal TClock by N so as to generate a sampling clock $CK_S$ having edges at appropriate timings. The deserializer 204 acquires the data signal TData with the sampling clock $CK_S$ as a trigger.

The clock signal TClock and the data signal TData output from the transceiver TX involve jitter. A strobe signal STRB generated by the CRU 202 follows the jitter of the clock signal TClock. Accordingly, the deserializer 204 is capable of correctly receiving the data signal having such jitter.

RELATED ART DOCUMENTS

[Patent Document 1]
US Patent Application Publication No. 2005/0222789
[Patent Document 2]
US Patent Application Publication No. 2002/0188888

Let us consider a case in which the transmitter TX shown in FIG. 1 is tested by means of a test apparatus (ATE: Automatic Test Equipment). The test apparatus receives a signal under test TData from a DUT (i.e., the transmitter TX shown in FIG. 1). The test apparatus compares the signal under test TData thus received with an expected value so as to judge the quality. In this case, the test apparatus does not necessarily include the same interface as that included in the receiver RX shown in FIG. 1.

With the test apparatus including no CRU 202, a PLL circuit frequency multiplies an internal reference clock employed in the test apparatus so as to generate a strobe signal. The signal under test TData is acquired using the strobe signal thus generated, and is compared with an expected value.

That is to say, the test apparatus performs a substantially asynchronous operation with respect to the DUT. As described above, the signal under test TData includes jitter or drift. In a case in which the phase shift between the received data and the expected value exceeds 1 UI (Unit Interval), this leads to a problem in that a DUT that should be assessed as a non-defective product is assessed as a defective product.

Description has been made regarding the source synchronous method. A similar problem can occur in a case of testing a transmitter TX employing a clock embedded method.

SUMMARY OF THE INVENTION

The present invention has been made in order to solve such a problem. Accordingly, it is an exemplary purpose of an embodiment of the present invention to provide a test apparatus that is capable of testing a device under test while reducing effects of jitter or drift.

An embodiment of the present invention relates to a test apparatus. The test apparatus comprises: a time measurement unit structured to measure a time interval between edges to be monitored in a signal under test including serial data output from a device under test; and a comparison judgment unit structured to calculate the number of bits included between the edges to be monitored, based on the time interval thus measured, and to compare the number of bits with an expected value thereof.

It is to be noted that any arbitrary combination or rearrangement of the above-described structural components and so forth is effective as and encompassed by the present embodiments. Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is coupled to the member B" includes a state in which the member A is indirectly coupled to the member B via another member that does not affect the electric connection between them, or that does not damage the functions of the connection between them, in addition to a state in which they are physically and directly coupled. Similarly, the state represented by the phrase "the member C is provided between the member A and the member B" includes a state in which the member A is indirectly coupled to the member C, or the member B is indirectly coupled to the member C via another member that does not affect the electric connection between them, or that does not damage the functions of the connection between them, in addition to a state in which they are directly coupled.

Figure 2:
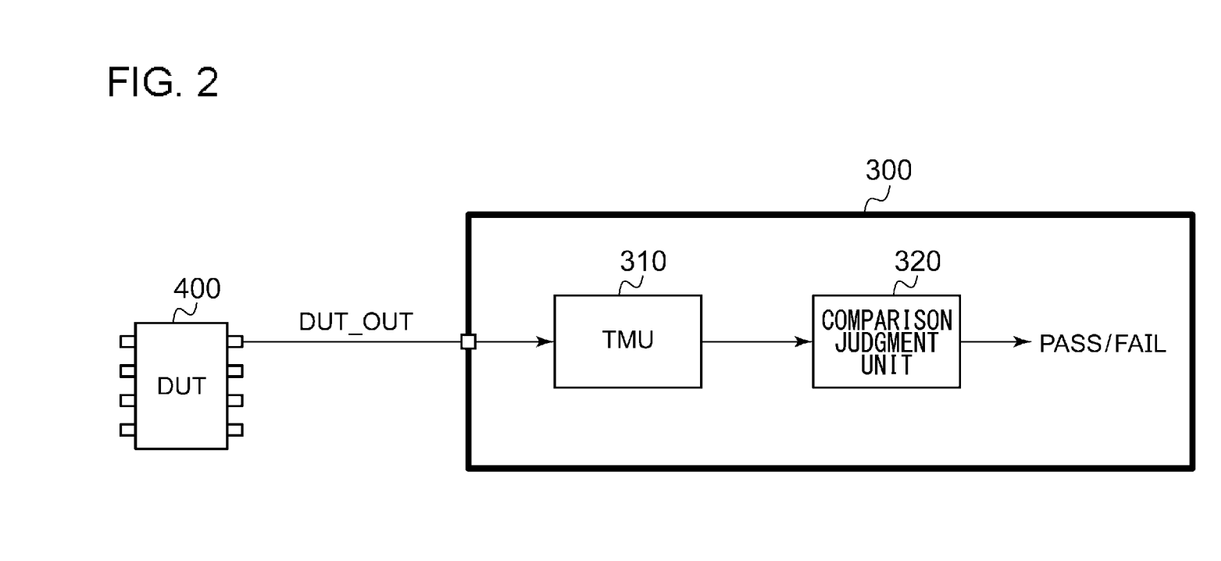
FIG. 2 is a block diagram showing a test apparatus according to an embodiment.

FIG. 2 is a block diagram showing a test apparatus 300 according to an embodiment. A DUT (Device Under Test) 400 includes a serial interface, and generates serial data. The test apparatus 300 performs a test with the serial data received from the DUT 400 as a signal under test. It should be noted that the serial interface mounted on the DUT 400 may employ the source synchronous method or the embedded clock method.

The test apparatus 300 includes a time measurement unit (TMU) 310 and a comparison judgment unit 320.

The time measurement unit 310 measures the time intervals $\Delta T_1, \Delta T_2, \ldots$, between edge to be monitored, for the signal under test output from the DUT 400 in the form of a serial signal (which will be referred to as the "DUT_Output signal"). As the edges to be monitored, all the edges in the DUT_Output signal may be employed. Also, positive edges (rising edges, leading edges) may be employed. Also, negative edges (falling edges, trailing edges) may be employed.

The comparison judgment unit 320 calculates the number of bits X of the serial data included between the edges to be monitored, based on the time intervals $\Delta T$ thus measured, and compares the number of bits X with an expected value $X_{EXP}$ thereof. Furthermore, the comparison judgment unit 320 generates a Pass/Fail signal that corresponds to a comparison result. Specifically, when the number of bits X of the serial data thus calculated matches the expected value $X_{EXP}$, judgment is made that the product is non-defective (Pass). Otherwise, judgment is made that the product is defective (Fail).

The comparison judgment unit 320 may be mounted in the form of a DSP (Digital Signal Processor).

When the number of bits of the serial data included between the edges to be monitored is detected as a non-integer value, rounding is performed. With such an arrangement, nearest rounding is preferably employed. Also, an arrangement may be made in which, when the tenths digit of such a non-integer value is greater than 5, it is rounded up, and otherwise, it is rounded down. Also, ordinary rounding-off may be employed. Also, an arrangement may be made in which, when the tenths digit of such a non-integer value is equal to or greater than 6, it is rounded up, and otherwise, it is rounded down.

For example, the time measurement unit 310 generates a time stamp T[i] for every edge to be monitored. Here, i represents the edge number.

The comparison judgment unit 320 calculates the edge time interval $\Delta T_i = T[i+1] - T[i]$. Furthermore, the comparison judgment unit 320 divides the edge time interval $\Delta T_i$ by an ideal unit interval $UI_{IDEAL}$ and rounds off the calculation result. The rounded result is employed as the number of bits $X_i$.

$$X_i = \text{Integer}((T[i+1] - T[i])/UI_{IDEAL})$$

Here, Integer( ) represents a function that returns an integer obtained by nearest rounding its argument.

The above is the basic configuration of the test apparatus 300. Next, description will be made regarding the operation thereof.

Figure 3:
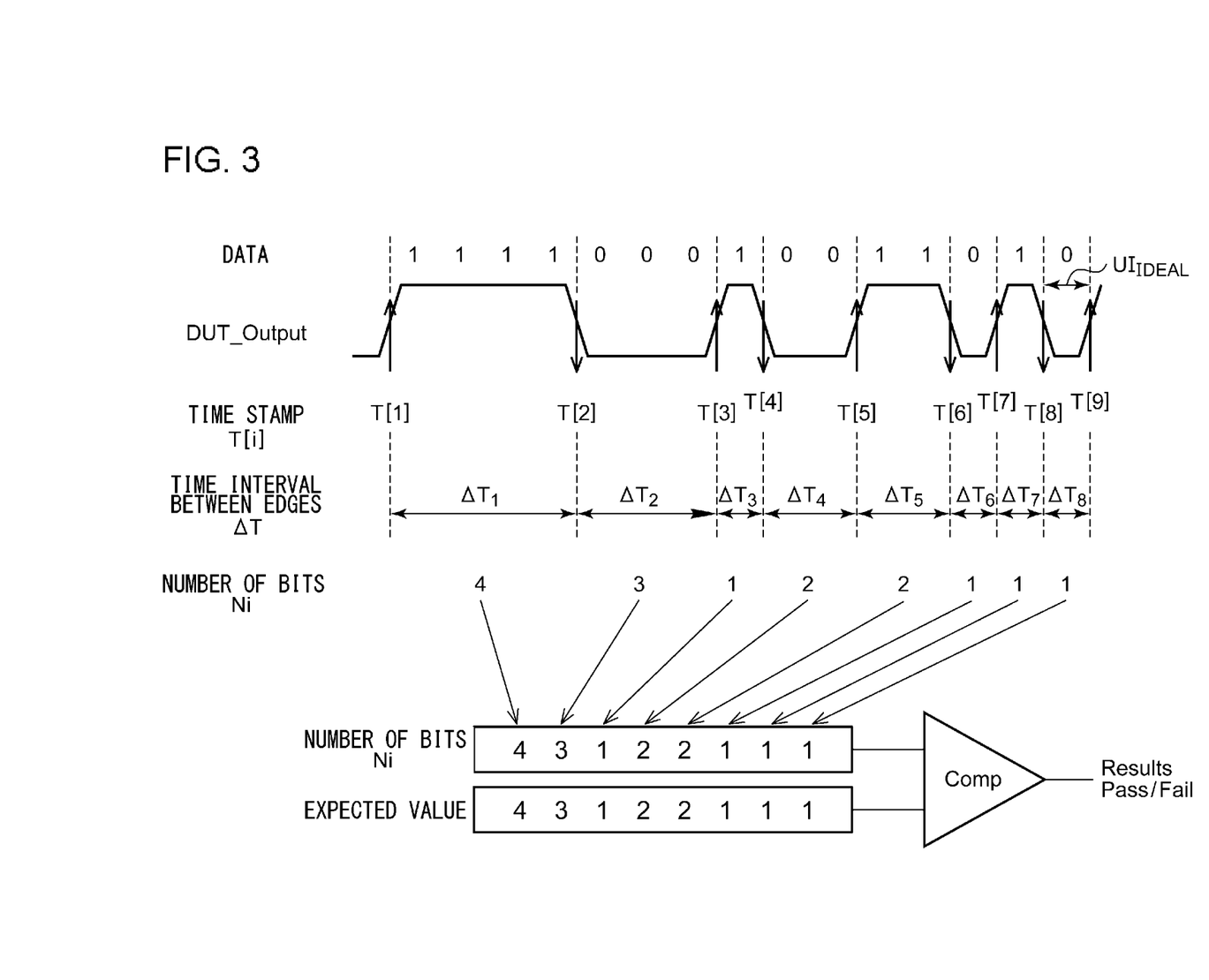
FIG. 3 is a waveform diagram showing the operation of the test apparatus shown in FIG. 2.

FIG. 3 is an operation waveform diagram showing an operation of the test apparatus shown in FIG. 2. Here, an example is shown in which a PRBS (Pseudo Random Binary Sequence) 4 is employed as the DUT_Output signal. In this example, the positive edges and negative edges are all monitored. The number of bits included between each pair of adjacent edges is detected, thereby obtaining $X_1$, $X_2$, $X_3$, .... Each detected value is compared with an expected value thereof so as to judge the quality.

As shown in FIG. 3, such a case in which all the edges are monitored is equivalent to an arrangement in which the number of consecutive high-level bits and the number of consecutive low-level bits are each detected and each compared with an expected value thereof.

Figure 4:
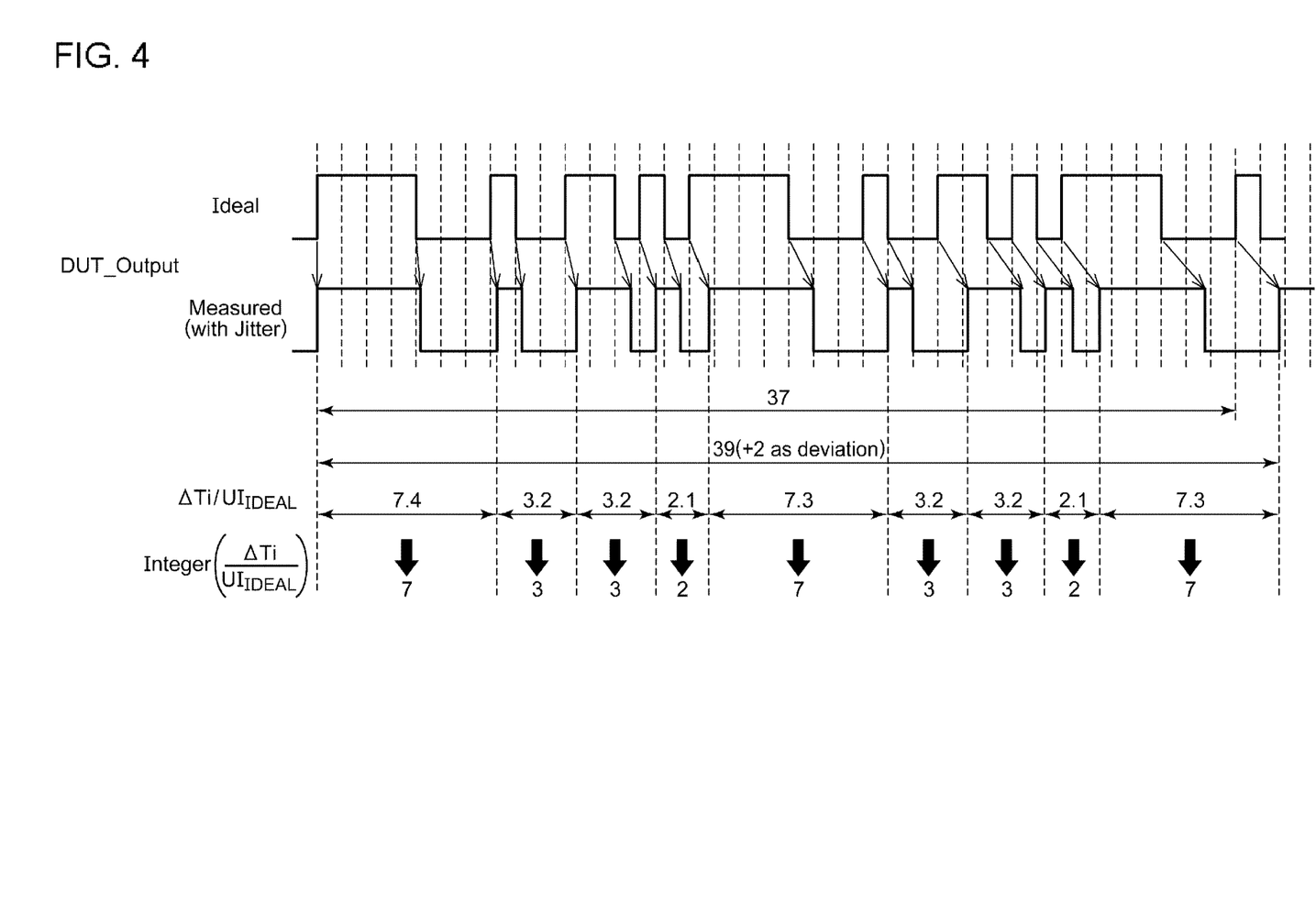
FIG. 4 is a diagram showing a mechanism of the test apparatus shown in FIG. 2 for reducing the effects of jitter.

Next, description will be made regarding a mechanism for reducing the effects of jitter or drift (which will collectively be referred to simply as "jitter" hereafter without distinguishing them). FIG. 4 shows an operation of the test apparatus shown in FIG. 2 in which the effects of jitter are reduced. As the DUT_Output signal, an ideal waveform and an actual waveform affected by jitter are shown.

In a case in which there is no effect of jitter, the number of bits included between each pair of edges is an integer value. In contrast, if the DUT_Output signal is affected by jitter, the number of bits included between each pair of edges, i.e., $(\Delta T_i/UI_{IDEAL})$ is a non-integer number. With the present embodiment, the number of bits $(\Delta T_i/UI_{IDEAL})$ calculated as a non-integer value is rounded, and the rounded value is compared with the expected value thereof. This allows the effects of jitter to be removed.

With this test method, in theory, this arrangement is capable of removing the effects of jitter that is smaller than $UI_{IDEAL}/2$ per bit. This arrangement is capable reducing the effects of drift, which is accumulated jitter, without any limitation. In the example shown in FIG. 4, this arrangement is capable of correctly judging the quality even if drift of 2 UI occurs for every 37 bits.

The above is the basic configuration and the operation of the test apparatus 300.

In a case in which a clock recovery circuit or a clock data recovery circuit is mounted on the test apparatus 300 as shown in FIG. 1, such a clock recovery circuit or clock data recovery circuit must be prepared for every kind (standard) of interface, leading to a problem of an increased cost of the test apparatus.

In contrast, with the test apparatus or the test method according to the present embodiment, this arrangement is capable of testing various kinds of DUTs including various kinds of transmitters regardless of the kind of interface and regardless of the data transmission method such as the source synchronous method, clock forward method, embedded clock method, etc.

In many cases, the test apparatus is provided with a circuit block having a time stamping function as a standard component or otherwise an optional component. In this case, by using the time stamping function, and by preparing a software program for providing a general-purpose DUT with a function of the comparison judgment unit 320, this provides a test according to the embodiment with low costs.

It should be noted that, instead of configuring the comparison judgment unit 320 as a DSP controlled in a software manner, the comparison judgment unit 320 may be mounted in the form of an FPGA (Field Programmable Gate Array) or an ASIC (Application Specified IC).

The present invention encompasses various kinds of apparatuses and methods that can be regarded as a block configuration or a circuit configuration shown in FIG. 2, or otherwise that can be derived from the aforementioned description. That is to say, the present invention is not restricted to a specific configuration. More specific description will be made below regarding example configuration and modifications for clarification and ease of understanding of the essence of the present invention and the circuit operation. That is to say, the following description will by no means be intended to restrict the technical scope of the present invention.

Figure 5:
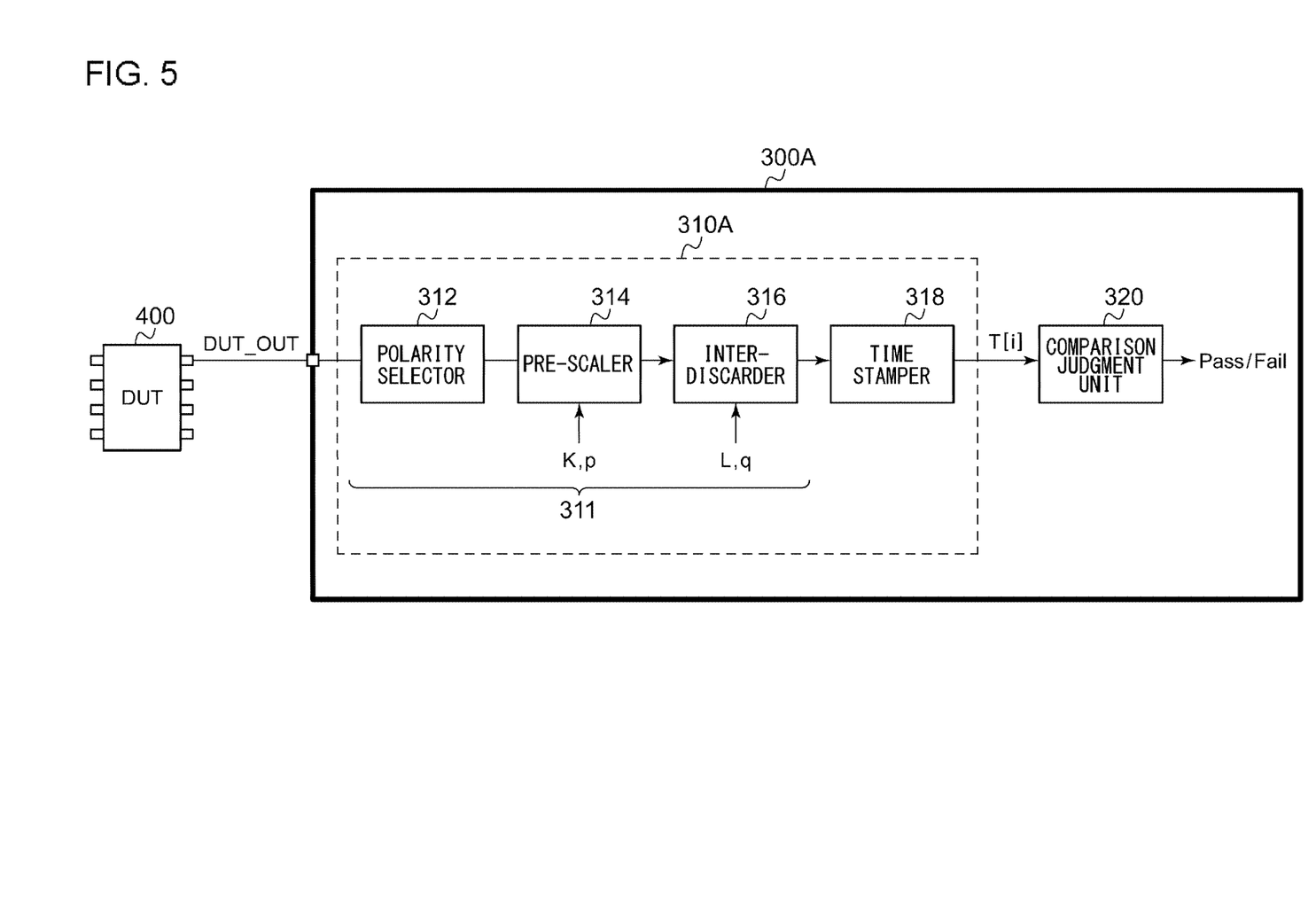
FIG. 5 is a block diagram showing a test apparatus according to an embodiment.

FIG. 5 is a block diagram showing a test apparatus 300A according to an embodiment. A time measurement unit 310A includes a data decimation unit 311 and a time stamper 318.

The data decimation unit 311 receives the signal under test DUT_Output and extracts the edges to be monitored. The remaining edges are discarded. The data decimation unit 311 includes a polarity selector 312, a pre-scaler 314, and an inter-discarder 316. The polarity selector 312 selects at least one edge polarity from among positive and negative with respect to the DUT_Output signal.

The edges thus selected by the polarity selector 312 are further thinned out by the pre-scaler 314 and the inter-discarder 316.

Specifically, the pre-scaler 314 receives the output signal of the polarity selector 312, and selects an edge for every K edges. Specifically, the pre-scaler 314 selects the $(p+1 \times K)$-th edge, the $(p+2 \times K)$-th edge, . . . , and the $(p+j \times K)$-th edge (j represents an integer 1, 2, . . . ). Here, p is a parameter designed to satisfy the relation 1 p K. In a case in which K=1, the pre-scaler 314 passes all the edges.

The inter-discarder 316 receives the edges selected by the pre-scaler 314, and selects an edge for every L edges. Specifically, the inter-discarder 316 selects the $(q+1 \times L)$-th edge, the $(q+2 \times L)$-th edge, . . . , and the $(q+j \times L)$-th edge (j represents an integer 1, 2, . . . ). Here, q is a parameter designed to satisfy the relation $1 \leq q \leq L$. In a case in which L=1, the inter-discarder 316 passes all the edges.

By employing a combination of the pre-scaler 314 and the inter-discarder 316, this arrangement is capable of selecting an edge for every N $(=K \times L)$ edges. By changing the parameter p from 1 up to K, and by changing the parameter q from 1 up to L, this arrangement is capable of measuring all the edge intervals.

The time stamper 318 assigns a time stamp T[i] to each edge of the output signal of the inter-discarder 316.

Next, description will be made regarding several examples of the operation of the test apparatus 300A.

First Example Operation

As shown in FIG. 3, in a case in which all the edges are to be monitored, in order to distinguish the high-bit period and the low-bit period, there is a need to distinguish the positive edge and the negative edge. That is to say, there is no difference in the measurement result (number of bits $X_i$) between a given bit string and the inverted bit string thereof. Accordingly, this arrangement has the potential to involve a problem in that a DUT that should be assessed as a defective product is assessed as a non-defective product. Accordingly, in a case in which all the edges are to be monitored, the test apparatus 300A is preferably configured to distinguish the positive edge and the negative edge, and to hold each time interval $\Delta T_i$ with information with respect to whether the time interval $\Delta T_i$ is a high-bit period or a low-bit period.

Figure 6A:
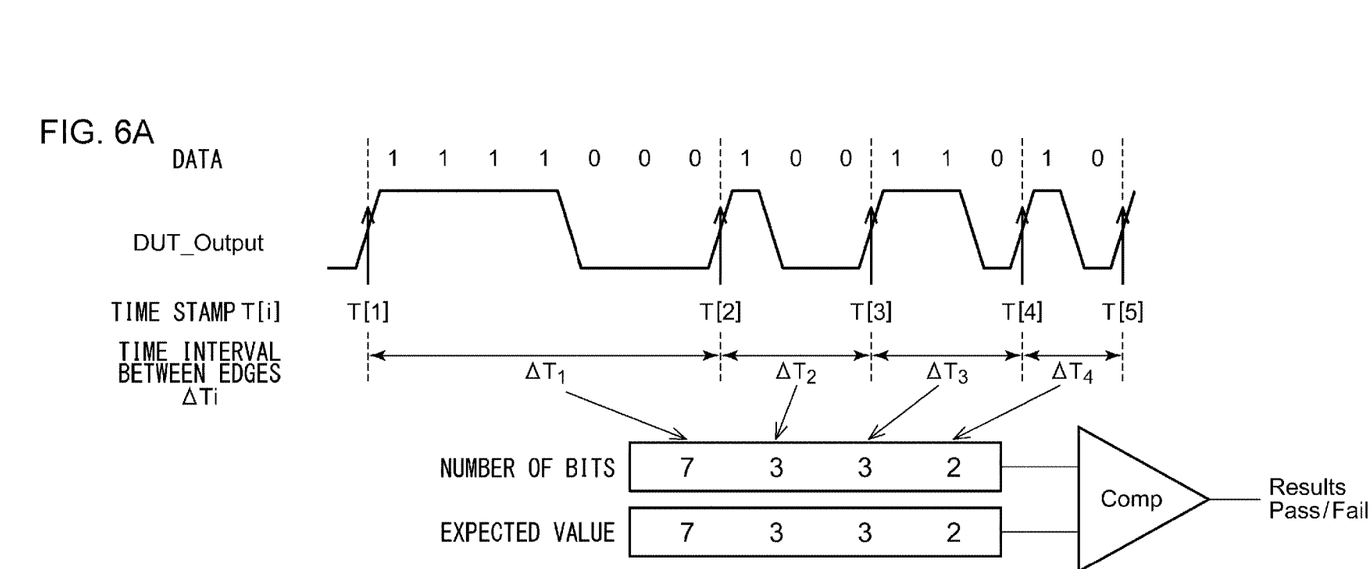
FIGS. 6A and 6B are waveform diagrams each showing a first example operation.
Figure 6B:
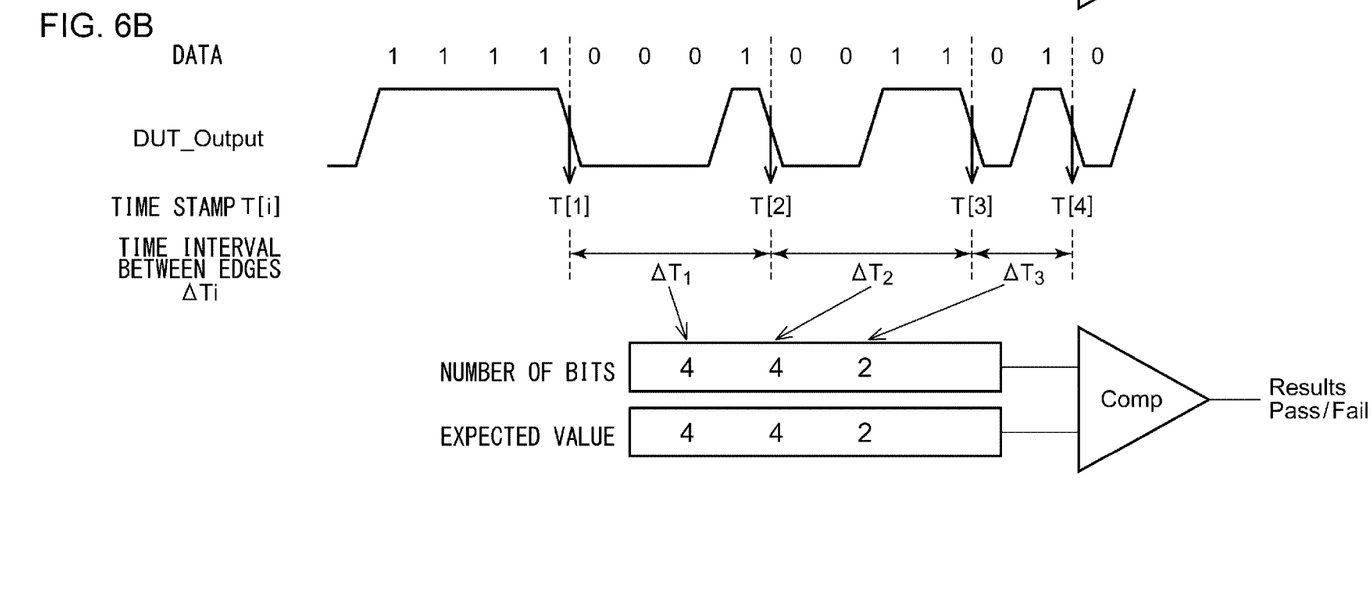

FIGS. 6A and 6B are waveform diagrams for describing the first example operation. FIG. 6A shows an operation in which the positive edges are monitored. This operation can be provided by the test apparatus 300A shown in FIG. 5, in which the positive edges are selected by the polarity selector 312, and the selected positive edges are further thinned out with K=1 (p=1) and L=1 (q=1). In this case, each expected value is an ideal number of bits included between a corresponding pair of positive edges. In this example, the expected values are 7, 3, 3, 2, . . . .

FIG. 6B shows the operation in a case in which the negative edges are monitored. In this example, the same signal under test is used as that shown in FIG. 6A. This operation shown in FIG. 6B can be provided by the test apparatus 300A shown in FIG. 5, in which the negative edges are selected by the polarity selector 312, and the selected negative edges are further thinned out with K=1 (p=1) and L=1 (q=1). In this case, each expected value is an ideal number of bits included between a corresponding pair of negative edges. In this example, the expected values are 4, 4, 2, . . . .

With the first example operation, a DUT that has passed both the test with respect to the positive edges and the test with respect to the negative edges is judged to be non-defective. Such a test in which the test with respect to the positive edge and the test with respect to the negative edge are performed for the same pattern generated by the DUT is equivalent to a test as shown in FIG. 3 in which the test is performed with respect to all the edges.

Second Example Operation

Figure 7:
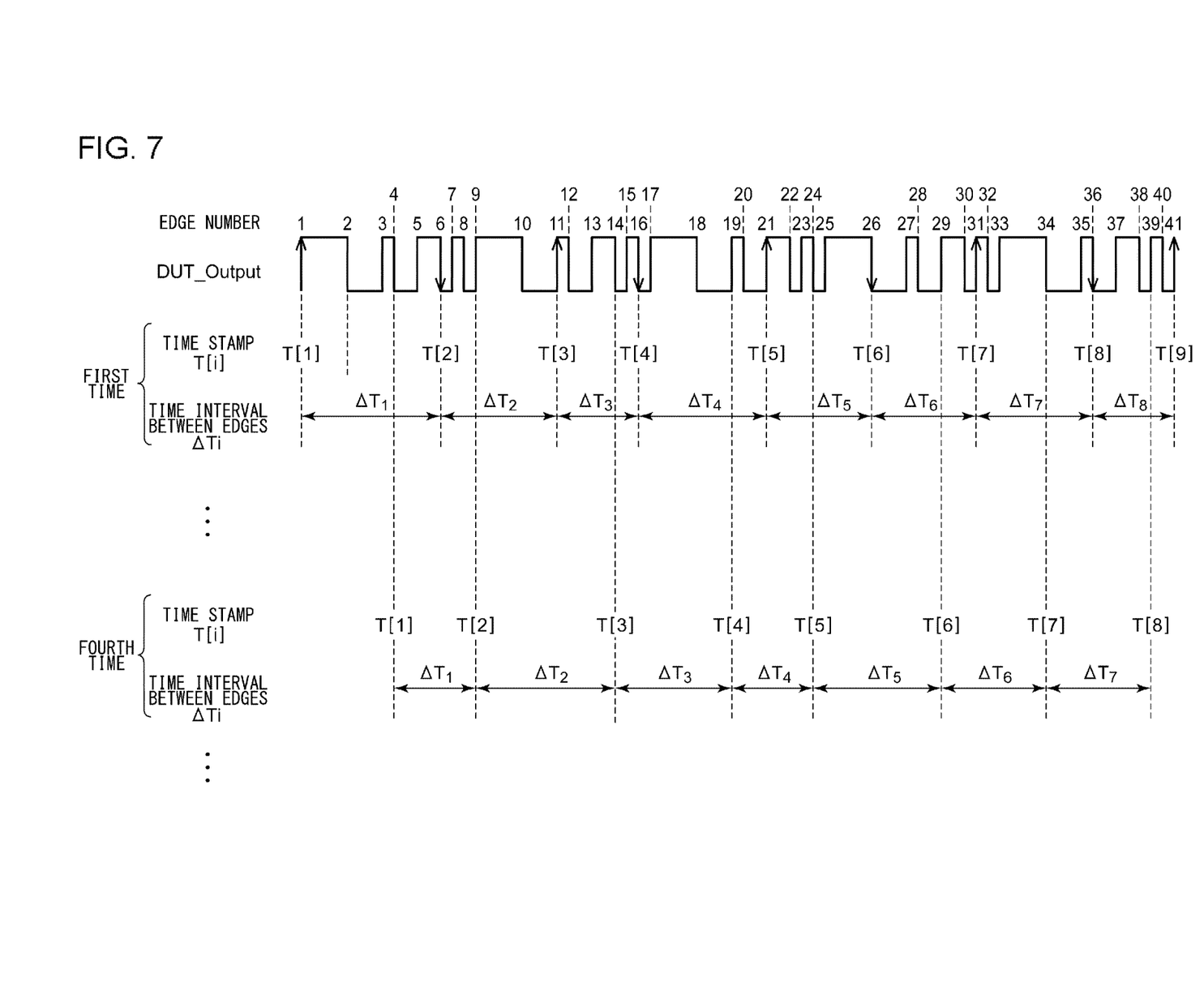
FIG. 7 is a waveform diagram showing a second example operation.

The first example operation can be regarded as an operation in which an edge to be monitored is selected for every N=2 edges. As a generalization of this, an edge to be monitored may be selected for every N edges. FIG. 7 is a waveform diagram showing a second example operation. FIG. 7 shows an example in which N=5. For convenience, the identifier numbers 1, 2, 3, . . . , are sequentially assigned from the top edge. For example, this operation can be provided by the test apparatus 300A shown in FIG. 5, in which the positive edges and the negative edges are both selected by the polarity selector 312, and the selected positive edges are further thinned out with K=5 and L=1 or otherwise with K=1 and L=5.

First, the first edge, the (1+N)-th edge, the $(1+2 \times N)$-th edge, . . . , and the $(1+j \times N)$-th edge are selected as the edges to be monitored. Subsequently, the time stamps T[1], T[2], . . . , and T[j] are assigned to the edges thus selected. Furthermore, the time intervals thereof $\Delta T_1, \Delta T_2, \ldots, \Delta T_j$, are acquired. In this example, the expected values are 37, 33, 33, . . . .

As the second test, the same test is performed for the second edge, the (2+N)-th edge, the (2+2×N)-th edge, . . . , and the (2+j×N)-th edge to be monitored. This test is repeated N times. As the last test, the same test is performed for the (N+N)-th edge, the (N+2×N)-th edge, . . . , and the (N+j×N)-th edge to be monitored. It should be noted that the order of the tests is not restricted in particular.

As a generalization, an edge to be monitored is selected for every N edges, and the test is executed for the i-th edge, the (i+N)-th edge, (i+2×N)-th edge, . . . , with i incremented from 1 to N. Here, i will be referred to as the "phase number". When the DUT has passed all the tests for i=1 to N, the DUT is judged to be non-defective.

In a case in which the signal under test has a very high bit rate, and in a case in which the test is to be performed with all the edges as the monitoring targets, the time measurement unit 310 is required to be designed to have high time resolution. Furthermore, the comparison judgment unit 320 is required to have high processing performance. This involves increased costs of hardware components. In order to solve such a problem, by selecting a relatively large number N, this arrangement is able to reduce the required performance levels for the time measurement unit 310 and the comparison judgment unit 320.

Third Example Operation

Figure 8:
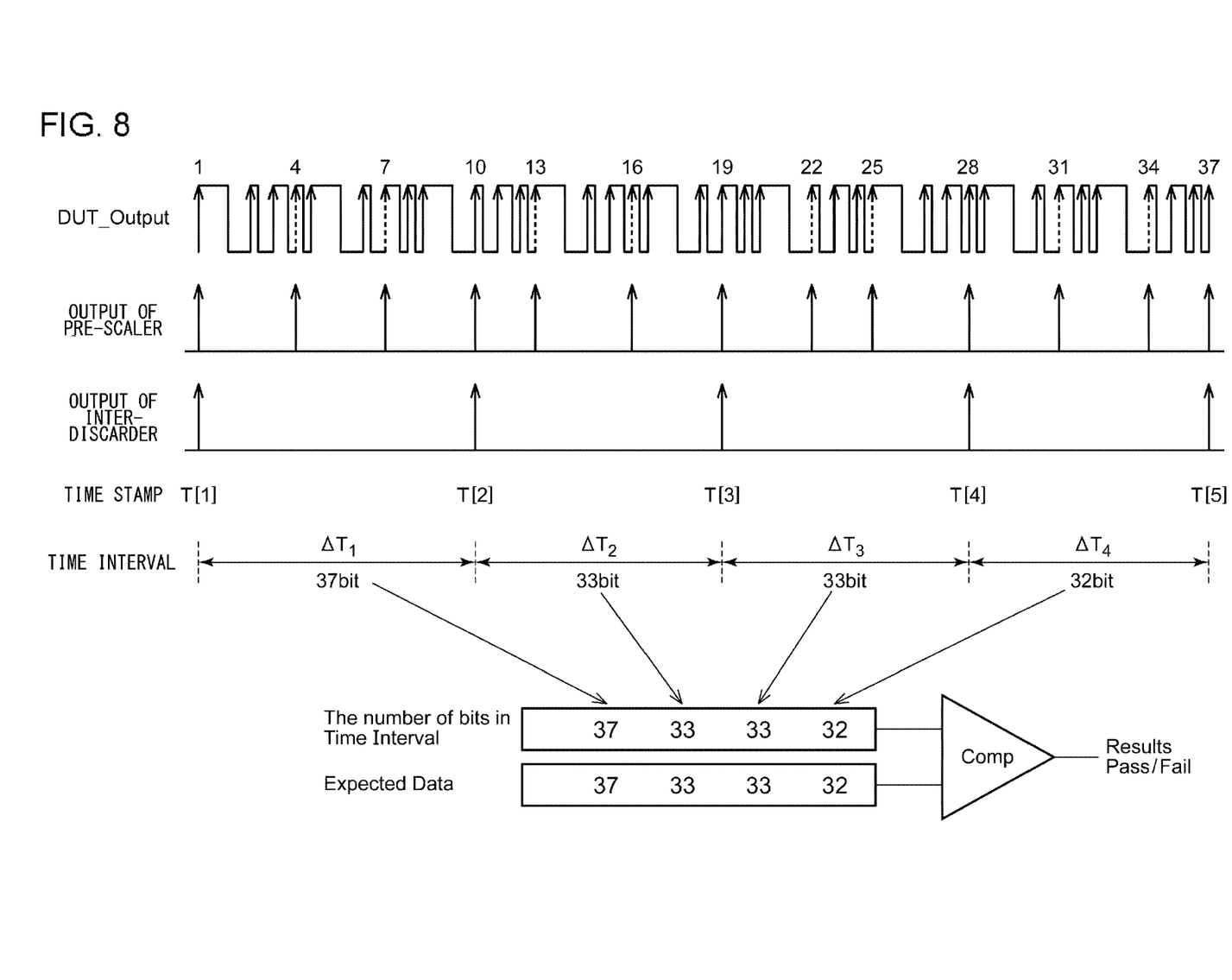
FIG. 8 is a waveform diagram showing a third example operation.

FIG. 8 is a waveform diagram showing a third example operation. The polarity selector 312 selects the positive edges. The setting value K=3 is set for the pre-scaler 314. In this example, the pre-scaler 314 selects an edge for every three edges with p=1. Accordingly, the edge numbers thus selected are 1, 4, 7, 10, . . . , (1+K×j).

The setting value L=3 is set for the inter-discarder 316. In a case in which q=1, the edge numbers 1, 10, 19, 28, . . . , are selected. The time stamps T[i] are generated for the edges thus selected. Furthermore, the number of bits $X_i$ included in each time interval $\Delta T_i$ is calculated. In this example, the expected values are 37, 33, 33, 32, . . . .

A similar test is performed for all the combinations of p and q. Here, p and q can each be regarded as a phase number. More specifically, in a case in which p=1 and q=2, a time stamp is assigned to each of the edges with the edge numbers 4, 13, 22, 31, . . . . In a case in which p=1 and q=3, a time stamp is assigned to each of the edges with the edge numbers 7, 16, 25, 34, . . . .

In a case in which p=2, the pre-scaler 314 selects the edges with the edge numbers 2, 5, 8, 11, . . . , (2+K×j). In a case in which q=1, the inter-discarder 316 selects the edges with the edge numbers 2, 11, 20, 29, . . . . In a case in which q=2, the inter-discarder 316 selects the edges with the edge numbers 5, 14, 23, 32, . . . . In a case in which p=2 and q=3, the edge numbers of the selected edges are 8, 17, 26, 35, . . . .

In a case in which p=3, the pre-scaler 314 selects the edges with the edge numbers 3, 6, 9, 12, . . . , (3+K×j). In a case in which q=1, the inter-discarder 316 selects the edges with the edge numbers 3, 12, 21, 30, . . . . In a case in which q=2, the inter-discarder 316 selects the edges with the edge numbers 6, 15, 24, 33, . . . . In a case in which p=3 and q=3, the edge numbers of the selected edges are 9, 18, 27, 36, . . . .

The same test is performed with respect to the inverted edge polarity, i.e., negative edges.

Fourth Example Operation

Figure 9:
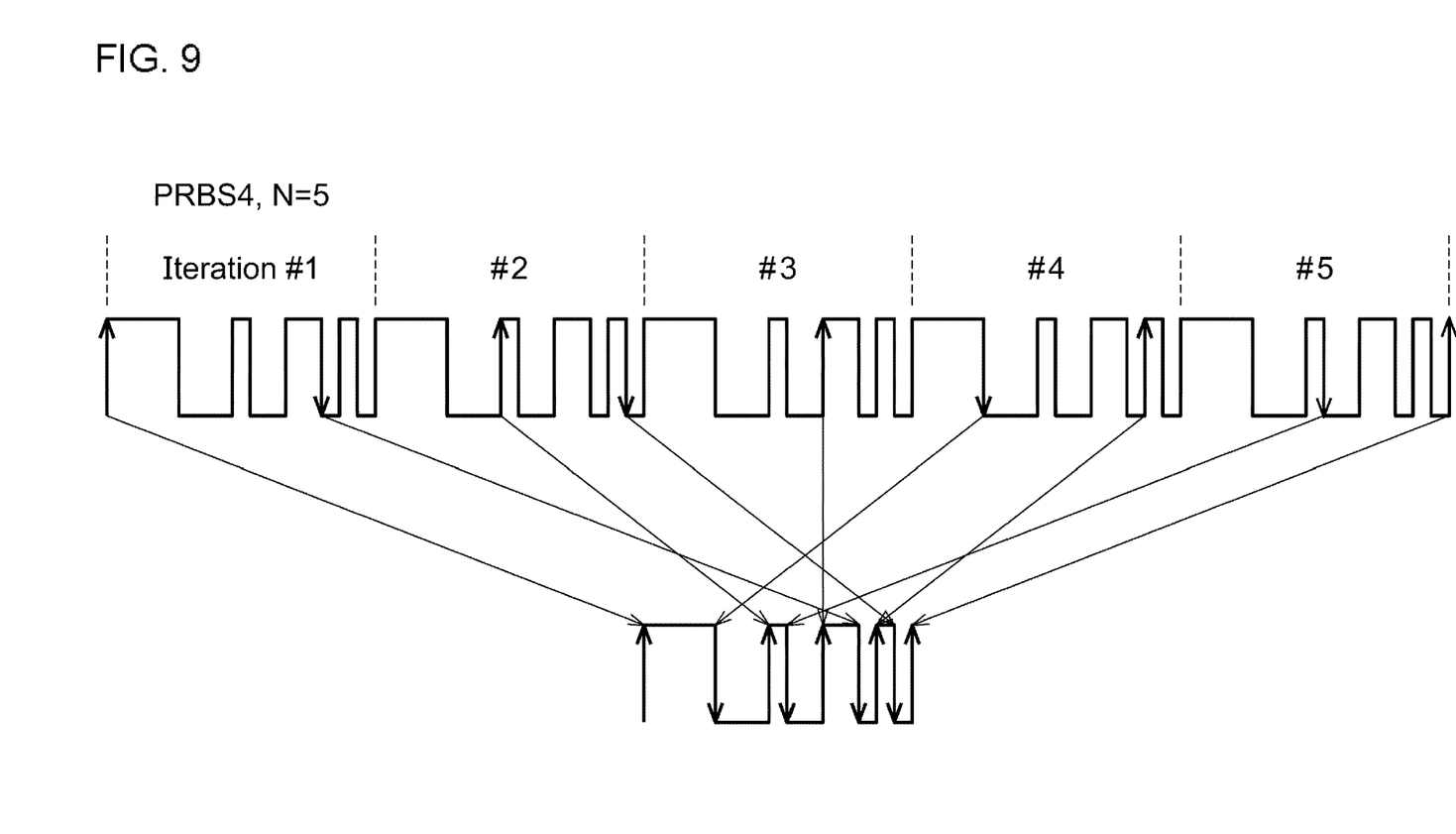
FIG. 9 is a waveform diagram showing a fourth example operation.

FIG. 9 is a waveform diagram showing a fourth example operation. In a case in which the number of edges included in each pattern period is an even number, and the number of edge intervals N to be monitored is an odd number, by repeating the measurement for the same pattern with a fixed phase number i(q, p), this arrangement is capable of testing for all the edge intervals. FIG. 8 shows an example in which the signal under test is PRBS4 and N=5. PRBS4 includes eight edges. In this case, by repeating the measurement for the same pattern N=5 times with a fixed phase number i=1, this arrangement is capable of monitoring all the edges. In a case of employing PRBS7, each pattern includes 64 edges.

Fifth Example Operation

In a case of employing a combination of a pre-scaler and an inter-discarder as described in the third example operation, by optimizing the combination of the number of edge intervals K and the number of edges included in each pattern period, this arrangement allows the measurement to be repeatedly performed for the same pattern with a fixed phase number p, as with the fourth example operation. Similarly, by optimizing the number of edge intervals L and the number of edges included in each pattern period, this arrangement allows the measurement to be repeatedly performed for the same pattern with a fixed phase number q.

Description has been made above regarding the present invention with reference to the embodiments. The above-described embodiments have been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

Modification 1

At least one component may be omitted from among the polarity selector 312, the pre-scaler 314, and the inter-discarder 316 included in the data decimation unit 311. It is needless to say that, in a case in which a high-speed time stamper or a high-speed DSP (comparison judgment unit 320) can be employed, the data decimation unit 311 may be omitted.

Modification 2

Description has been made regarding an arrangement in which PRBS4 is employed as the signal under test. However, the present invention is not restricted to such an arrangement. Also, PRBS7 or the like may be employed.

Modification 3

Description has been made in the embodiment regarding an arrangement in which the number of bits of serial data included between each pair of edges is acquired in the form of an integer value, and the integer value thus acquired is compared with an expected value thereof. However, the present invention is not restricted to such an arrangement.

For example, the number of bits $X_i'$ of serial data included between each pair of edges may be acquired in the form of a non-integer value (floating-point data, for example) as represented by $X_i'=(T[i+1]-T[i])/UI_{IDEAL}$.

Subsequently, judgment may be made regarding whether or not the number of bits $X_i'$ thus calculated is included in an expected range.

For example, in a case in which the expected value of the number of bits $X_i$ is an integer value $X_{EXPi}$, the expected range may be set to a range between $(X_{EXPi}-0.5)$ and $(X_{EXPi}+0.5)$. In this case, when the relation $(X_{EXPi}-0.5)<X_i'<(X_{EXPi}+0.5)$ holds true, judgment may be made that the measurement result is "pass". Otherwise, judgment may be made that the measurement result is "fail".

While the preferred embodiments of the present invention have been described using specific terms, such description is for illustrative purposes only, and it is to be understood that changes and variations may be made without departing from the spirit or scope of the appended claims.

What is claimed is:

1. A test apparatus comprising:
   a time measurement unit operable to measure a plurality of time intervals in a signal under test, wherein the signal under test includes a plurality of edges and the plurality of edges include a plurality of monitored edges, wherein respective time intervals in the plurality of time intervals correspond to respective measurements of time between the monitored edges, wherein the signal under test includes serial data output from a device under test; and
   a comparison judgment unit operable to calculate a number of bits in of the serial data output included between the monitored edges, based on the respective time intervals in the plurality of time intervals included in the signal under test, and to compare the number of bits with an expected number of bits value to generate a comparison result.

2. The test apparatus according to claim 1, wherein the time measurement unit is operable to generate a respective time stamp T[i] for each of the monitored edges, and wherein the comparison judgment unit is operable to round off a quotient obtained by dividing respective edge intervals interval represented by $\Delta Ti=T[i+1]-T[i]$ by an ideal unit interval to generate a calculation result, and to employ the calculation result as the number of bits of the serial data output, wherein the respective edge intervals correspond to the respective time intervals between the monitored edges.

3. The test apparatus according to claim 2, wherein the time measurement unit comprises:
   a data decimation unit operable to select the monitored edges of the signal under test for each N of the plurality of edges, wherein N represents a first integer; and
   a time stamper operable to assign the time stamp to the monitored edges extracted by the data decimation unit.

4. The test apparatus according to claim 3, wherein the data decimation unit comprises a polarity selector operable to select at least one of a positive edge or a negative edge from the signal under test.

5. The test apparatus according to claim 3, wherein the data decimation unit comprises:
   a pre-scaler operable to select respective edges for each K of the plurality of edges, wherein K represents a second integer; and
   an inter-discarder arranged on a downstream stage from the pre-scaler, and operable to select respective edges extract for each L of the plurality of edges, wherein L represents a third integer.

6. The test apparatus according to claim 1, wherein the comparison judgment unit is mounted in a DSP (Digital Signal Processor).

7. The test apparatus according to claim 1, wherein the comparison judgment unit is operable to generate a pass/fail signal that corresponds to the comparison result.

8. The test apparatus according to claim 7, wherein a value of the pass/fail signal indicates a pass if the comparison result is a match.

9. The test apparatus according to claim 7, wherein a value of the pass/fail signal indicates a fail if the comparison result is not a match.

10. A test method for a signal under test including serial data output from a device under test, the test method comprising:
    measuring a plurality of time intervals in a signal under test, wherein the signal under test includes a plurality of edges and the plurality of edges include a plurality of monitored edges, wherein respective time intervals included in the plurality of time intervals correspond to respective measurements of time between respective monitored edges included in the plurality of monitored edges, wherein the signal under test includes serial data output from a device under test;
    calculating a number of bits of the serial data output included between the respective monitored edges, based on the respective time intervals in the plurality of time intervals; and
    comparing the number of bits that is calculated with an expected value to generate a comparison result.

11. The test method according to claim 10, wherein respective ones of the plurality of monitored edges are selected for each N of the plurality of edges, and wherein the test method is executed with respective i-th edge of the plurality of edges, an (i+N)-th edge of the plurality of edges, (i+2×N)-th edge of the plurality of edges, . . . , as the monitored edges, while incrementing i from 1 to N.

12. The test method according to claim 10, wherein a monitored edge is extracted for each N of the plurality of edges, wherein N is an odd number, and wherein the test method is executed with predetermined edge numbers of the plurality of edges while repeatedly inputting the signal under test comprising an even number of the plurality of edges for each pattern period in a plurality of pattern periods.

13. The test method according to claim 10, further comprising: generating a pass/fail signal that corresponds to the comparison result.

14. The test method according to claim 13, wherein a value of the pass/fail signal indicates a pass if the comparison result is a match.

15. The test method according to claim 13, wherein a value of the pass/fail signal indicates a fail if the comparison result is not a match.

16. A test apparatus comprising:
    a time measurement unit operable to measure a plurality of time intervals in a signal under test, wherein the signal under test includes a plurality of edges and the plurality of edges include a plurality of monitored edges, wherein respective time intervals in the plurality of time intervals correspond to respective measurements of time between the monitored edges, wherein the signal under test includes serial data output from a device under test;

a comparison judgment unit operable to calculate a number of bits of the serial data output included between the monitored edges based on the respective time intervals in the plurality of time intervals, and to compare the number of bits with an expected value to generate a comparison result; and a jitter remover operable to remove jitter from the signal under test by rounding the number of bits to an integer value.

17. The test apparatus according to claim 16, wherein the comparison judgment unit is operable to generate a pass/fail signal that corresponds to the comparison result.

18. The test apparatus according to claim 17, wherein the time measurement unit is operable to generate respective time stamps for the monitored edges.

19. The test apparatus according to claim 18, wherein the time measurement unit comprises:

a data decimation unit operable to select the monitored edges of the signal under test for each N of the plurality of edges, wherein N represents a first integer; and a time stamper operable to assign the respective time stamps to the monitored edges, wherein the monitored edges are selected by the data decimation unit.

20. The test apparatus according to claim 19, wherein the data decimation unit comprises a polarity selector operable to select at least one of a positive edge or a negative edge from the signal under test.

\* \* \* \* \*